United States Patent
Wilson et al.

(10) Patent No.: US 7,396,750 B2
(45) Date of Patent: Jul. 8, 2008

(54) METHOD AND STRUCTURE FOR CONTACTING TWO ADJACENT GMR MEMORY BIT

(75) Inventors: Vicki Wilson, St. Paul, MN (US); Guoqing Zhan, St. Paul, MN (US); Ray Buske, St. Paul, MN (US); James Chyi Lai, St. Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 162 days.

(21) Appl. No.: 11/533,093

(22) Filed: Sep. 19, 2006

(65) Prior Publication Data

US 2007/0070555 A1    Mar. 29, 2007

Related U.S. Application Data

(60) Provisional application No. 60/721,214, filed on Sep. 28, 2005.

(51) Int. Cl.
*H01L 21/44* (2006.01)

(52) U.S. Cl. ............... 438/597; 438/599; 438/618; 438/652; 438/672; 438/675; 257/E21.209; 257/E21.658; 257/E21.665; 257/E27.006; 257/E27.104

(58) Field of Classification Search ............... 438/597, 438/599, 618, 652, 672, 675; 257/E21.209, 257/E21.658, E21.665
See application file for complete search history.

(56) References Cited

U.S. PATENT DOCUMENTS

| 6,236,079 | B1 * | 5/2001 | Nitayama et al. | 257/306 |
| 6,376,370 | B1 * | 4/2002 | Farrar | 438/678 |
| 2002/0173139 | A1 * | 11/2002 | Kweon | 438/627 |
| 2002/0195641 | A1 * | 12/2002 | Fukuda et al. | 257/306 |
| 2005/0099844 | A1 * | 5/2005 | Witcraft et al. | 365/158 |

* cited by examiner

*Primary Examiner*—Thanh V Pham
(74) *Attorney, Agent, or Firm*—Thomas, Kayden, Horstemeyer & Risley

(57) ABSTRACT

A method and a structure are provided for improving the contact of two adjacent GMR memory bits. Two adjacent bit ends are connected by utilizing a single via.

15 Claims, 1 Drawing Sheet

METHOD AND STRUCTURE FOR CONTACTING TWO ADJACENT GMR MEMORY BIT

CROSS-REFERENCE TO RELATED APPLICATION

This application claims the priority benefit of provisional application Ser. No. 60/721,214, filed Sep. 28, 2005, the full disclosure of which is incorporated herein by reference.

BACKGROUND

1. Field of Invention

The present invention relates to a static memory. More particularly, the present invention relates to magnetoresistive random access memory (MRAM).

2. Description of Related Art

Magnetoresistive random access memory is a type of non-volatile memory with fast programming time and high density. A MRAM cell has two ferromagnetic layers separated by a non-magnetic layer. Information is stored as directions of magnetization vectors in the two ferromagnetic layers.

In conventional MRAM of a standard structural design, a single via is utilized for each GMR (Giant Magnetoresistance) memory bit end, and a metal is deposited into each via. However, the via in such conventional design is usually small, which results in residue remained inside the via after etching. In addition, the smaller via also causes unfavorable electrical contact between two adjacent GMR memory bits.

For the forgoing reasons, there is a need for developing a method and a structure to improving the contact of two adjacent GMR memory bit.

SUMMARY

A method is provided for contacting two adjacent GMR memory bits. First, a GMR stack layer is formed on a first dielectric layer, which is on a substrate. Then, the GMR stack layer is patterned to form at least two GMR memory bits. Next, a second dielectric layer is formed on the GMR memory bits and the first dielectric layer. Then, the second dielectric layer is patterned to form a via to expose two adjacent ends of the GMR memory bits. Finally, a metal plug is formed in the via and on the second dielectric layer.

A connection for two adjacent GMR memory bits is also provided, wherein at least two GMR memory bits are on the first dielectric layer, on a substrate. In addition, a second dielectric layer is on the first dielectric layer and the GMR memory bits, wherein a via in the second dielectric layer is to expose two adjacent ends of the GMR memory bits. Finally, a metal plug is filled in the via and on the second dielectric layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the preferred embodiment, with reference made to the accompanying drawings as follows.

DESCRIPTION OF THE PREFERRED EMBODIMENTS

Figure 1A:
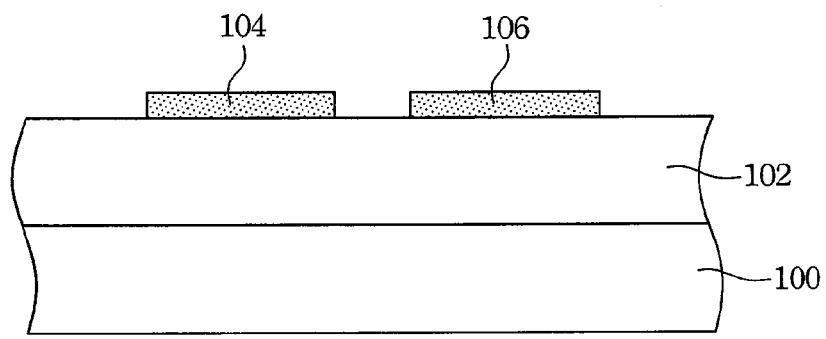
FIGS. 1A-1C depicts a cross-sectional view of manufacturing process according to one embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
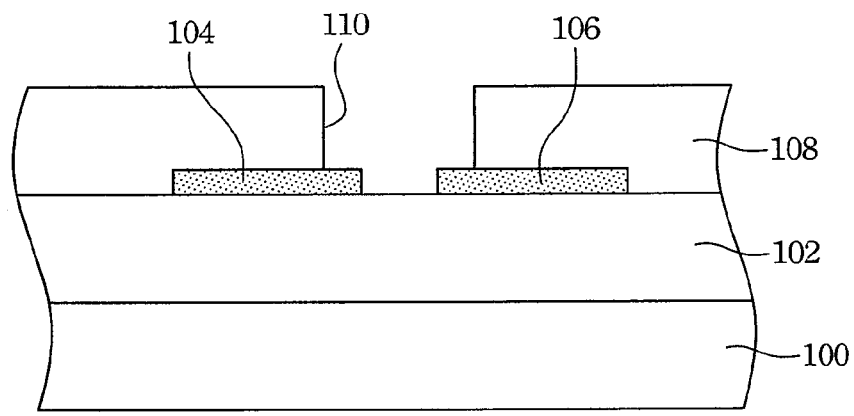
Figure 1C:
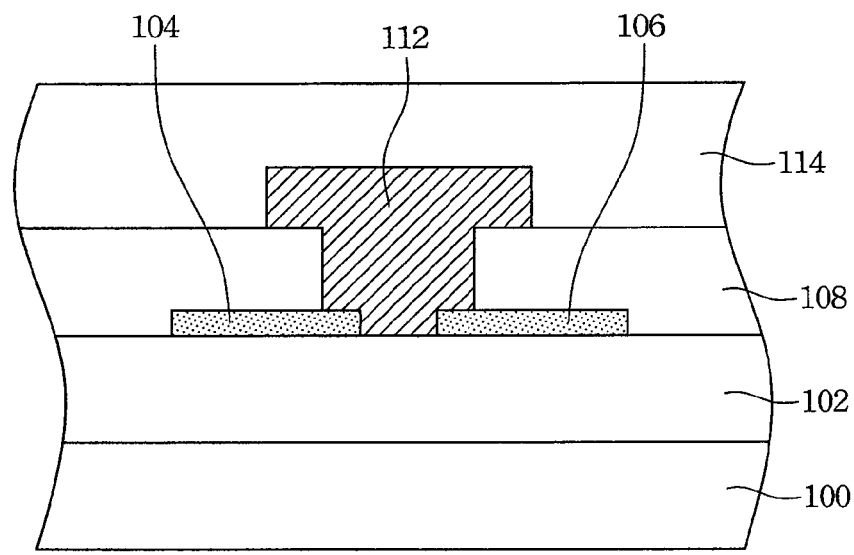

According to one embodiment of the present invention, a manufacturing process is proved, wherein one single larger via is utilized for two adjacent bit ends. FIGS. 1A-1C illustrate a cross-sectional view of manufacturing process of the embodiment of this invention. First, referring to FIG. 1A, a substrate 100 having a first dielectric layer 102 thereon is provided. Then a GMR stack layer is deposited and patterned on the first dielectric layer 102 to form GMR memory bits 104 and 106. Patterning is performed by, for example, a photolithography process and an etching process sequentially.

Next, as shown in FIG. 1B, a second dielectric layer 108 is formed on the first dielectric layer 102 and both GMR memory bits 104 and 106, and then is patterned to form a via 110 therein. Patterning is performed by, for example, a photolithography process and an etching process sequentially. After that, the via 110 is formed to exposes two adjacent ends of the GMR memory bits 106 and 104.

Referring to FIG. 1C, a metal layer is deposit to fill into via 110 and on the second dielectric layer 108. The metal layer is then patterned to form a metal plug 112 in the via 110 and on the second dielectric layer 108 to electrically connect the two adjacent ends of the GMR memory bits. The metal plug 112 used herein can be, for example, tungsten, or other conductive metals, which connects two adjacent ends of the GMR memory bits 104 and 106.

A third dielectric layer 114 can be further formed on the second dielectric layer 108 and the metal plug 112. The first dielectric layer 102, the second dielectric layer 108, and the third dielectric layer 114 are formed by, such as chemical vapor deposition. Moreover, a material of the dielectric layers 102, 108 and 114 can be, for example, silicon oxide, silicon nitride, silicon oxynitride, metal oxide, or other usable dielectric materials. The thickness of the dielectric layer is about 1500-3500 Angstroms.

Accordingly, a larger via is proved, which decreases residue inside the via after etching process. In addition, since a single larger via is utilized for two adjacent bit ends, higher density bit layout is allowed. The electrical contact between the two adjacent GMR memory bits is also improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for contacting two adjacent GMR memory bits, comprising:

forming a GMR stack layer on a first dielectric layer, which is on a substrate;

patterning the GMR stack layer to form at least two GMR memory bits;

forming a second dielectric layer on the at least two GMR memory bits and the first dielectric layer;

patterning the second dielectric layer to electrically connect the two adjacent ends of the at least two GMR memory bits to form a via to expose two adjacent ends of the GMR memory bits; and forming a metal plug in the via and on the second dielectric layer.

2. The method of claim 1, wherein the second dielectric layer is formed by chemical vapor deposition.

3. The method of claim 1, wherein the second dielectric layer is silicon oxide, silicon nitride, silicon oxynitride, or metal oxide.

4. The method of claim 1, wherein the thickness of the second dielectric layer is 1500-3500 angstroms.

5. The method of claim 1, wherein the metal plug is tungsten.

6. The method of claim 1, wherein the step of forming the metal plug comprises:

depositing a metal layer into the via and on the second dielectric layer; and patterning the metal layer.

7. The method of claim 1, further comprising forming a third dielectric layer on the second dielectric layer and the metal plug after the step of forming the metal plug.

8. The method of claim 7, wherein the third dielectric layer is formed by chemical vapor deposition.

9. The method of claim 7, wherein the third dielectric layer is silicon oxide, silicon nitride, silicon oxynitride, or metal oxide.

10. A connection for two adjacent GMR memory bits, comprising:

a first dielectric layer on a substrate;

at least two GMR memory bits on the first dielectric layer;

a second dielectric layer on the first dielectric layer covering the at least two GMR memory bits, wherein the second dielectric layer has a via therein to expose two adjacent ends of the at least two GMR memory bits; and a metal plug filled in the via and on the second dielectric layer to electrically connect two adjacent ends of the at least two GMR memory bits.

11. The method of claim 10, wherein the second dielectric layer is silicon oxide, silicon nitride, silicon oxynitride, or metal oxide.

12. The method of claim 10, wherein the thickness of the second dielectric layer is 1500-3500 angstroms.

13. The method of claim 10, wherein a metal plug is tungsten.

14. The method of claim 10, further comprising a third dielectric layer on the second dielectric layer and the metal plug.

15. The method of claim 14, wherein the third dielectric layer is silicon oxide, silicon nitride, silicon oxynitride, or metal oxide.

* * * * *